United States Patent [19]

Tanizawa

[11] Patent Number: 4,562,364

[45] Date of Patent: Dec. 31, 1985

[54] TTL CIRCUIT IN WHICH TRANSIENT CURRENT IS PREVENTED FROM FLOWING THERETHROUGH

[75] Inventor: Tetsu Tanizawa, Kawasaki, Japan

[73] Assignee: Fujitsu Limited, Kawasaki, Japan

[21] Appl. No.: 423,716

[22] Filed: Sep. 27, 1982

[30] Foreign Application Priority Data

Sep. 26, 1981 [JP] Japan ................. 56-152674
Sep. 28, 1981 [JP] Japan ................. 56-151999

[51] Int. Cl.$^4$ ............... H03K 19/088; H03K 17/16
[52] U.S. Cl. .......................... 307/454; 307/443; 307/456; 307/360
[58] Field of Search ........... 307/443, 446, 454, 360, 307/456–458

[56] References Cited

U.S. PATENT DOCUMENTS

| 4,092,552 | 5/1978 | Hoehn | 307/456 X |
| 4,132,906 | 1/1979 | Allen | 307/443 |
| 4,228,371 | 10/1980 | Mazgy | 307/270 X |
| 4,413,194 | 11/1983 | Birch | 307/456 |

FOREIGN PATENT DOCUMENTS 1532506 of 0000 France .
55-60339 of 0000 Japan .

OTHER PUBLICATIONS

IBM Technical Disclosure Bulletin, "T$^2$L Compatible Push-Pull Drivers", Chin, vol. 14, No. 8, Jan. 1972, p. 2289.
IBM Technical Disclosure Bulletin, "Schottky Clamp for Transistor Breakdown", Culican, et al., vol. 21, No. 4, Sep. 1978, pp. 1454–1455.

Primary Examiner—John S. Heyman
Assistant Examiner—D. Hudspeth
Attorney, Agent, or Firm—Staas & Halsey

[57] ABSTRACT

A TTL circuit comprising an inverted signal output transistor (Tr$_4$) and an off buffer circuit (Tr$_2$, Tr$_3$), alternately turned on and off in response to an input signal, to provide an inverted output. According to the invention, two driving circuits for driving the inverted signal output transistor and the off buffer circuit are separately provided. The threshold voltage of the circuit for driving the off buffer circuit is lower than the threshold voltage of the circuit for driving the inverted signal output transistor, whereby no transient current flows through the off buffer circuit and the inverted signal output transistor.

6 Claims, 9 Drawing Figures

TTL CIRCUIT IN WHICH TRANSIENT CURRENT IS PREVENTED FROM FLOWING THERETHROUGH

BACKGROUND OF THE INVENTION

1. Field of the Invention

The present invention relates to a transistor-transistor logic (TTL) circuit. More particularly, it relates to a TTL inverter having a transient state of a high impedance output for reducing the transient current.

Transistor-transistor logic inverters are generally used as basic elements in semiconductor integrated circuits. Inverters constructed by PNP transistors or NPN transistors are known. In the following description, TTL inverters constructed with NPN transistors are explained. However, the present invention is also applicable to TTL inverters constructed with PNP transistors. 2. Description of the Prior Art A conventional TTL inverter comprises a single phase-splitter transistor for splitting the phase of an input signal, which is applied to the base of the phase splitter transistor, into a non-inverted phase at its emitter and an inverted phase at its collector; an inverted signal output transistor for inverting the signal of the noninverted phase; and an off buffer circuit connected in series with the inverting transistor for receiving the inverted phase signal from the collector of the phase splitter transistor, whereby the input signal applied to the input end is inverted at the output end. In principle, the off buffer circuit and the inverted signal output transistor are alternately turned on and off in response to the outputs of the phase splitter transistor.

In the above-mentioned conventional TTL inverter, however, there are the following disadvantages. That is, in a transient period during which the output signal changes from an "H" (high) level to an "L" (low) level or vice versa, there is a period when both the off buffer circuit and the inverted signal output transistor are simultaneously conductive so that a large transient current flows therethrough. This transient current brings about not only an increase in power consumption but also a fluctuation of the power supply voltage, the fluctuation causing error operations of the external or internal circuits. In a large-scale integrated logic circuit, the transient currents in the inverters accumulate, resulting in a more serious problem in the above-mentioned error operations.

When the off buffer circuit comprises a single transistor for obtaining an "H" level of the output voltage higher than the "H" level given by the off buffer circuit comprises two transistors in a Darlington connection, a conventional TTL inverter requires a noninverting gate connected between the collector of the phase splitter transistor and the off buffer circuit. The noninverting gate comprises a number of elements. Because of the number of elements, the conventional TTL inverter of this type has a low integration degree and a low operating speed.

SUMMARY OF THE INVENTION

It is, therefore, a primary object of the present invention to prevent the transient current from flowing through a TTL circuit.

A second object of the present invention is to prevent error operations in various circuits having a common power supply line with a TTL circuit, the error operations being caused by the fluctuation of the power supply voltage due to the transient current flowing through the TTL circuit.

A third object of the present invention is to reduce the power consumption in the TTL circuit.

A fourth object of the present invention is to increase the degree of integration in the TTL circuit.

A fifth object of the present invention is to increase the operating speed of the TTL circuit.

The above objects are attained by a TTL circuit comprising an input end for receiving an input signal, an output end for providing a logical output in response to the input signal, an inverted signal output circuit including a first transistor having a first control electrode connected to the input end and a second transistor connected between the first transistor and the output end, the inverted signal output circuit having a first threshold voltage and being turned on when the input signal is at a high logic level to make the output end a low logic level. An off-buffer circuit is connected to the output end, being turned on to make the output end a high logical level when the input signals are at a low logical level. An off-buffer driving circuit has a third transistor connected between the input end and the off-buffer circuit and a second control electrode connected to the input end. The off-buffer driving circuit also has a second threshold voltage lower than the first threshold voltage of the inverted signal output circuit, whereby the off-buffer circuit is turned off before the turning on of the inverted signal output circuit and is turned on after the inverted signal output circuit is turned off.

BRIEF DESCRIPTION OF THE DRAWINGS

The above objects and other objects, as well as the features of the present invention will be better understood from the following description of the embodiments in comparison with the prior art, with reference to the accompanying drawings, in which.

DESCRIPTION OF THE PREFERRED EMBODIMENTS

Figure 1:
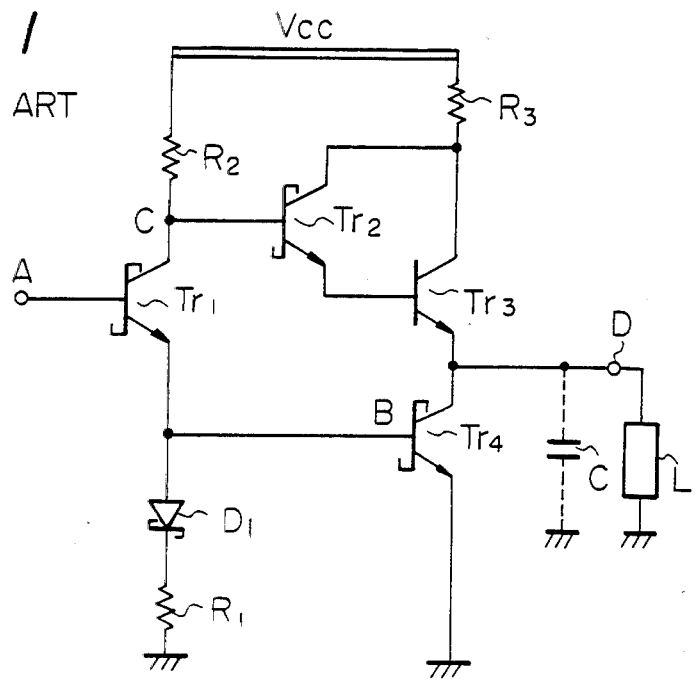
FIG. 1 is a circuit diagram of a conventional TTL inverter.

Before describing the embodiments of the present invention, an example of a conventional TTL inverter and the disadvantages therein will be described with reference to FIGS. 1 through 3. In FIG. 1, $Tr_1$ is a phase splitter transistor, the base of which operatively receives an input signal applied to an input end A connected to the base, the collector of which provides an output having a phase inverted from that of the input signal, and the emitter of which provides another output having the same phase as the input signal. Transistors $Tr_2$ and $Tr_3$, in a Darlington connection, comprises an off buffer circuit. The "off buffer" circuit will be described later. A transistor $Tr_4$ connected in series with the transistor $Tr_3$ is an inverted signal output transistor, the base of which is connected to the emitter of the phase splitter transistor $Tr_1$. Between the emitter of the transistor $Tr_1$ and ground, a diode $D_1$ and a resistor $R_1$ are connected in series. The diode $D_1$ and the resistor $R_1$ function to increase the switching speed of the inverted signal output transistor $Tr_4$ when it turns off by drawing charges on its base to ground. An output end D is connected to a node commonly connected to the emitter of the transistor $Tr_3$ and the collector of the transistor $Tr_4$. A capacitor C connected to the output end D is a load capacitor of the output line. To the output end D, a load resistor L is connected.

Figure 2:
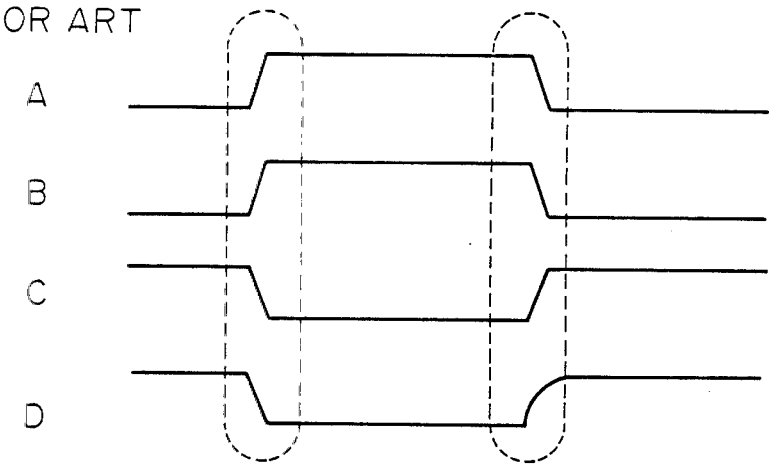
FIG. 2 is a waveform diagram at various nodes in the circuit of FIG. 1.

In the operation of the circuit of FIG. 1, as illustrated in FIG. 2, when the input signal applied to the input end A is at the "L" level, the transistor $Tr_1$ is in the off state so that, on the one hand, the base B of the transistor $Tr_4$ is connected to the emitter of the transistor $Tr_1$ and is at the "L" level, and, on the other hand, the base of the transistor $Tr_2$ is connected to the collector C of the transistor $Tr_1$ and is at the "H" level. Thus, in this state, the inverted signal output transistor $Tr_4$ is in the off state, and the off buffer circuit, consisting of the transistors $Tr_2$ and $Tr_3$, is in the on state so as to maintain the off state of the inverted signal output transistor $Tr_4$. In this state, therefore, the output end D is maintained at the "H" level. The name "off buffer" is derived from this function of keeping the inverted signal output transistor $Tr_4$ off and from the fact that this off buffer circuit includes the buffering transistor $Tr_2$.

When the input signal applied to the input end A is at the "H" level, the phase splitter transistor $Tr_1$ is in the on state so that its collector C is at the "L" level and its emitter connected to the base B of the inverted signal output transistor $Tr_4$ is at the "H" level. Accordingly, the output end D is at the "L" level.

In the transient states as illustrated in FIG. 2 by broken circles, however, there is a problem of a large transient current flowing through the transistors $Tr_3$ and $Tr_4$ in the conventional circuit of FIG. 1. The problem of the transient current, when the input A changes from the "L" level to the "H" level, will be explained with reference to FIG. 3. In the following description, $V_{BE}$ (about 0.8 V) is the base-emitter voltage when the transistor $Tr_1$, $Tr_2$, $Tr_3$, or $Tr_4$ is conductive, $V_{CE}$ is the collector-emitter voltage of the transistor when it is saturated, and $V_f$ (about 0.5 V), which is lower than $V_{BE}$, is the anode-cathode voltage of the diode $D_1$ when it is conductive. In FIG. 3, when the input voltage applied to the input end A is lower than the sum of the base-emitter voltage $V_{BE}$ of the transistor $Tr_1$ and the anode-cathode voltage $V_f$ of the diode $D_1$, the transistor $Tr_1$ is in the off state so that its collector potential is equal to the power supply potential $V_{CC}$ and its emitter potential is equal to ground potential. Therefore, the transistors $Tr_2$ and $Tr_3$ are conductive and the transistor $Tr_4$ is not conductive, with the result that the output end D is at a high logic level $V_{OH}$, which is nearly equal to $V_{CC} - 2V_{BE}$, i.e., the base potential of the transistor $Tr_2$ minus the base-emitter voltage of the two stages of the transistors $Tr_2$ and $Tr_3$.

When the input voltage reaches $V_{BE} + V_f$ or more, the transistor $Tr_1$ begins to be turned on so that the potential at its collector C begins to be lowered, and, accordingly, the transistors $Tr_2$ and $Tr_3$ become unsaturated, with the result that the potential at the output end D is gradually lowered. Then, when the input voltage further increases to reach $2V_{BE}$, the transistors $Tr_1$ and $Tr_4$ are saturated so that they are completely turned on, with the result that the potential at the collector C is lowered to the sum of the collector-emitter voltage $V_{CE}$ of the transistor $Tr_1$ and the base-emitter voltage of the transistor $Tr_4$ and the potential at the output end D is lowered to the collector-emitter voltage $V_{CE}$ of the transistor $Tr_4$. Since the potential difference between the base of the transistor $Tr_2$ and the emitter of the transistor $Tr_3$ is now $(V_{CE} + V_{BE}) - V_{CE} = V_{BE}$, the transistor $Tr_2$ is turned off. However, there are remaining charges on the base of the transistor $Tr_3$, so that, for an instant, the transistor $Tr_3$ is still in the on state even after the transistor $Tr_2$ is turned off. Therefore, there is an instantaneous current flowing from the power supply line $V_{CC}$ through the transistors $Tr_3$ and $Tr_4$ to ground. This instantaneous current causes the above-mentioned problem.

Figure 3:
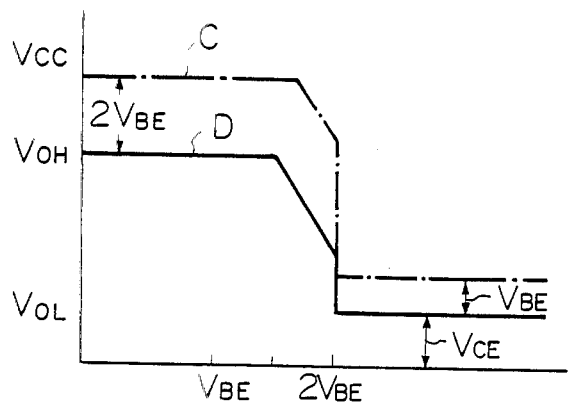
FIG. 3 is a waveform diagram for explaining a transient state when the circuit of FIG. 1 is switching.

Although FIG. 3 illustrates an input voltage at the input end A higher than $2V_{BE}$, it cannot be increased to higher than $2V_{BE}$ because it is clamped to $2V_{BE}$ by the on-state transistors $Tr_1$ and $Tr_4$.

When the input voltage at the input end A is decreased from $2V_{BE}$ to the "L" level, a similar instantaneous current also flows through the transistors $Tr_3$ and $Tr_4$ because of the remaining charges on the base of the transistor $Tr_4$.

The primary object of the present invention is to prevent the above-mentioned instantaneous current from flowing through the transistors $Tr_3$ and $Tr_4$ during a transient period.

Figure 4:
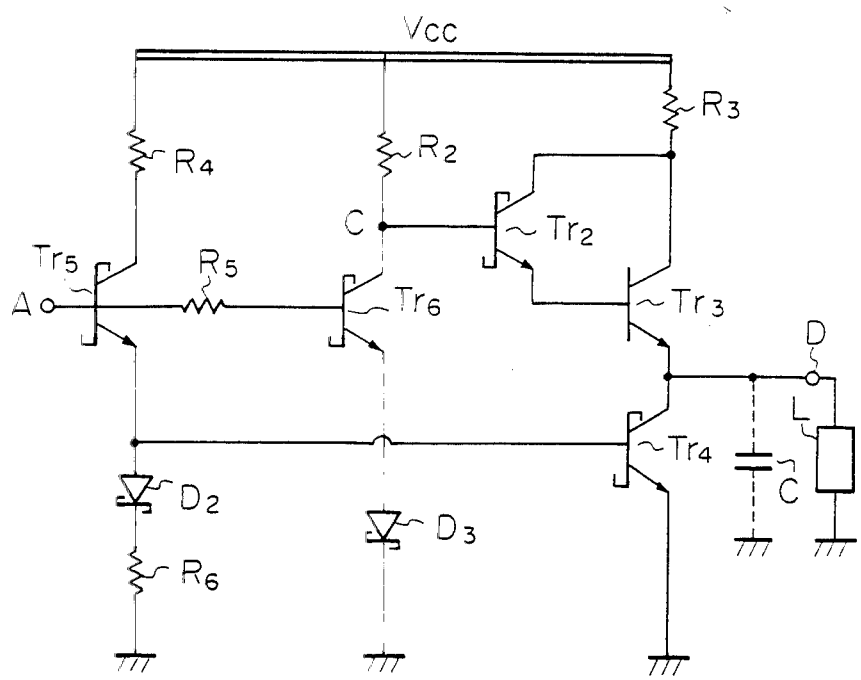
FIG. 4 is a circuit diagram of a TTL inverter according to an embodiment of the present invention.
Figure 5:
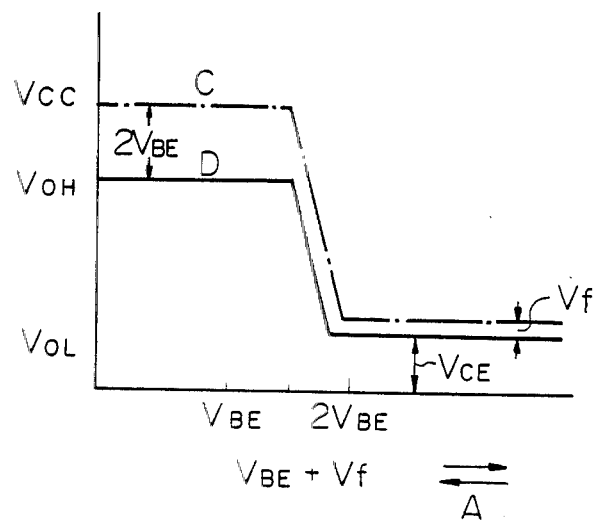
FIG. 5 is a waveform diagram for explaining a transient state when the circuit of FIG. 4 is switching.

An embodiment of the present invention will now be described with reference to FIGS. 4 and 5. In FIG. 4, the main difference between the conventional circuit of FIG. 1 and the circuit of FIG. 4 is that, in FIG. 4, instead of the single-phase splitter transistor $Tr_1$ in FIG. 1, two transistors $Tr_5$ and $Tr_6$ are employed. The transistor $Tr_5$ is used for driving only the inverted signal output transistor $Tr_4$. The transistor $Tr_6$ is used for driving only the off buffer circuit, including the transistors $Tr_2$ and $Tr_3$. The base of the transistor $Tr_5$ is connected to the input end A, its collector is connected through a resistor $R_4$ to the power supply line $V_{CC}$, and its emitter is connected to the base of the inverted signal output transistor $Tr_4$ and, through a diode $D_2$ and a resistor $R_6$ connected in series for drawing the charges on the base of the transistor $Tr_4$ when it turns on, to ground. In place of the diode $D_2$ and the resistor $R_6$, a single resistor may alternatively be used. The base of the transistor $Tr_6$ is connected through a resistor $R_5$ to the input end A, its collector is connected to the base of the transistor $Tr_2$ in the off buffer circuit and, through a load resistor $R_2$, to the power supply line $V_{CC}$, and its emitter is connected through a diode $D_3$ to the ground. The resistor $R_5$ is provided for preventing the base potential of the transistor $Tr_6$ from being clamped to $V_{BE} + V_f$. That is, by providing the resistor $R_5$, the potential at the input end A can be increased to $2V_{BE}$. The transistors $TR_2$ and $Tr_3$ comprising the off buffer circuit, the inverted signal output transistor $Tr_4$, the load capacitance C, and the load resistance L are the same as those in the circuit of FIG. 1.

The operation of the circuit of FIG. 4 will be described with reference to FIG. 5. When the potential of the input signal at the input end A is lower than $V_{BE}+V_f$, the transistors $Tr_5$ and $Tr_6$ are in the off state so that the transistors $Tr_2$ and $Tr_3$ are on and the transistor $Tr_4$ is off, resulting in a high potential level $V_{OH}=V_{CC}-2 V_{BE}$ at the output end D. When the input potential at the input end A increases to more than $V_{BE}+V_f$, the transistor $Tr_6$ begins to be turned on so that the potential at its collector C begins to be lowered to the sum of its collector-emitter voltage and the anode-cathode voltage of the diode $D_3$ until the transistor $Tr_6$ is completely turned on and saturated. The transistors $Tr_2$ and $Tr_3$ are in the on state as long as the transistor $Tr_6$ is not saturated. Therefore, the potential at the emitter of the transistor $Tr_3$ connected to the output end D is lowered, as is the potential at the base of the transistor $Tr_2$ connected to the collector C of the transistor $Tr_6$. When the transistor $Tr_6$ is saturated, the transistor $Tr_2$ is not supplied with the base current so that the transistor $Tr_2$ and then the transistor $Tr_3$ are turned off. After the transistor $Tr_3$ is turned off, and when the input potential further increases to reach 2 $V_{BE}$, the transistor $Tr_4$ is turned on so that the output potential at the output end D is clamped to the low logic level $V_{OL}$ equal to $V_{CE}$ of the transistor $Tr_4$. Since the transistor $Tr_3$ is in the off state after the transistor $Tr_6$ is saturated, no transient current flows through the transistors $Tr_3$ and $Tr_4$.

During a switching period when the input potential is lowered from $2 V_{BE}$ to a level lower than $V_{BE}$, the transistor $Tr_4$ is first turned off and then the transistor $Tr_6$ is turned off. Accordingly, the transistor $Tr_3$ is turned on only after the transistor $Tr_4$ is turned off. Thus, in this case also, no transient current flows through the transistors $Tr_3$ and $Tr_4$.

Figure 6:
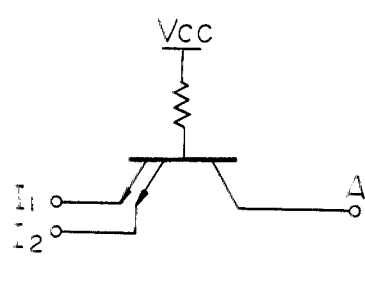
FIGS. 6 and 7 are circuit diagrams of circuits connected to the input end of the circuit of FIG. 4.
Figure 7:
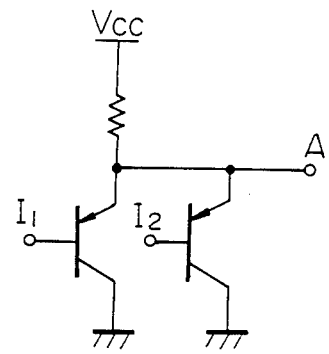

As is well known, a multi-emitter transistor, as illustrated in FIG. 6, or an AND circuit comprising PNP transistors, as illustrated in FIG. 7, may be connected to the input end A of the circuit of FIG. 4.

In the embodiment of FIG. 4, in order to obtain a high operating speed, Schottky barrier transistors are employed as the transistors $Tr_2$, $Tr_4$, $Tr_5$, and $Tr_6$. However, the scope of the present invention also covers the case when these transistors are not Schottky barrier transistors. Also, the transistors $Tr_2$ through $Tr_6$ may alternatively be PNP transistors. Further, as an alternative to the Schottky barrier diode $D_3$, a conventional transistor having a base-emitter voltage lower than $V_{BE}$ may be used by connecting its collector to its base.

Figure 8:
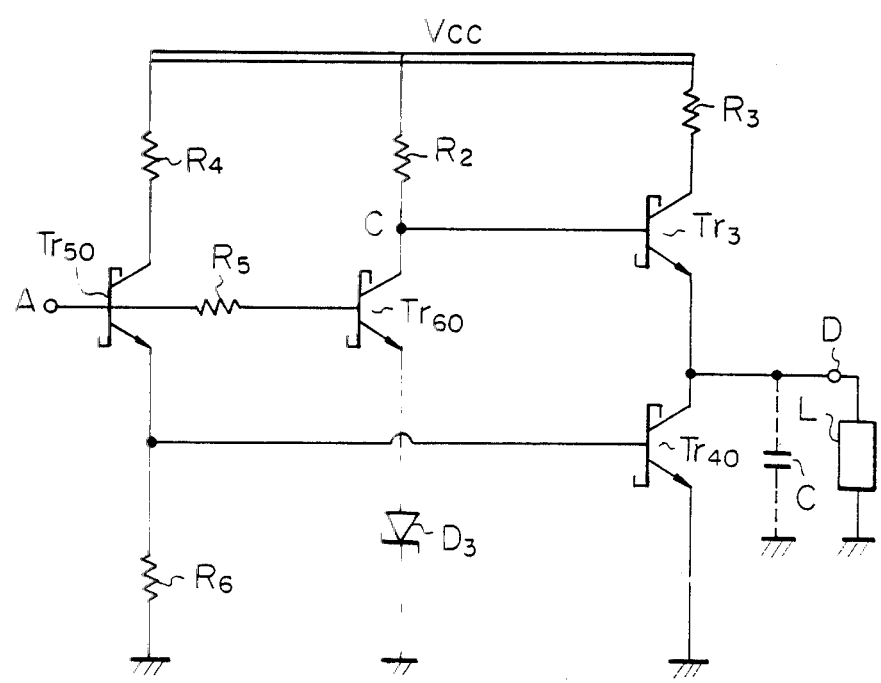
FIG. 8 is a circuit diagram of a TTL inverter according to a second embodiment of the present invention.

FIG. 8 shows another embodiment of the present invention. The differences between FIGS. 4 and 8 are that, in FIG. 8, the single transistor $Tr_3$, instead of the two transistors $Tr_2$ and $Tr_3$ of the off buffer circuit in FIG. 4, constitutes an off buffer circuit. By eliminating the transistor $Tr_2$ and by directly connecting the collector of the transistor $Tr_{60}$ to the base of the transistor $Tr_3$, the high logic level at the output end D of FIG. 8 is nearly equal to $V_{CC}-V_{BE}$, which is higher by $V_{BE}$ than the high logic level $V_{CC}-2 V_{BE}$ at the output end D of FIG. 4. Conventionally, a TTL inverter having such a high "H" level output cannot be formed as simply as the circuit of FIG. 8. That is, in FIG. 8, when the output potential at the output end D is the "L" level, both the transistors $Tr_{60}$ and $Tr_{40}$ are in the on state so that the potential difference between the collector C of the transistor $Tr_{60}$ and the output end D is $(V_{CE}+V_f)-V_{CE}=V_f$, which is lower than $V_{BE}$. Therefore, the transistor $Tr_3$ is surely off at this state. However, in the conventional circuit of FIG. 1, if the transistor $Tr_2$ is eliminated and the collector of the transistor $Tr_1$ is directly connected to the base of the transistor $Tr_3$, the transistor $Tr_3$ would always be conductive because when the output potential is at the "L" level, the potential difference between C and D would be $V_{BE}$ so as to maintain the on state of the transistor $Tr_3$.

Figure 9:
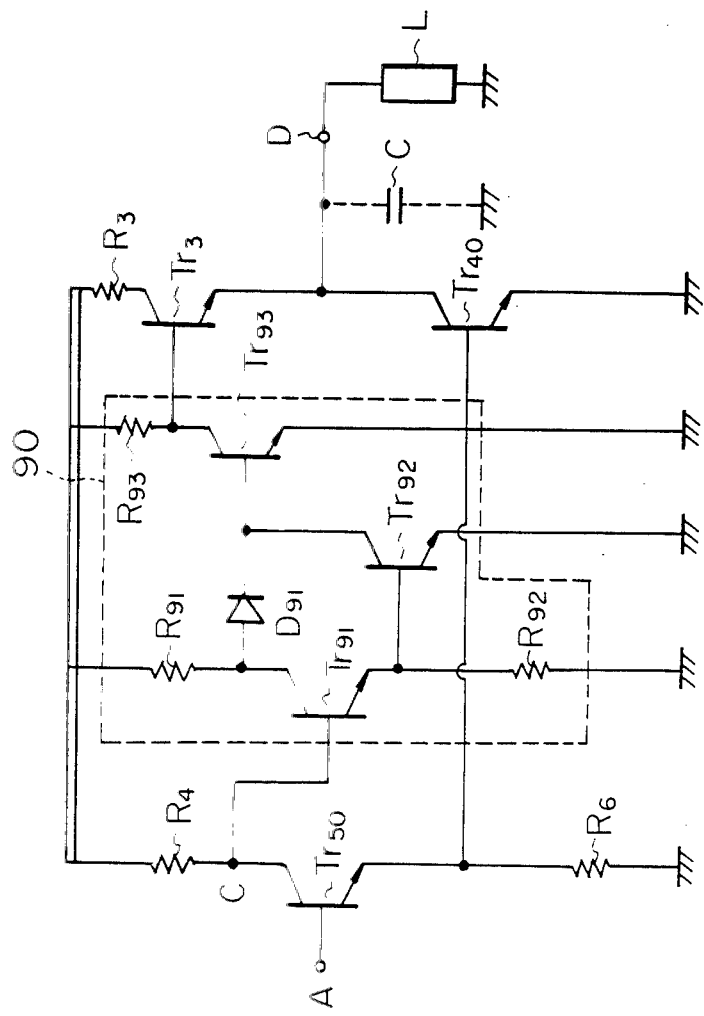
FIG. 9 is a circuit diagram of a conventional TTL inverter.

Conventionally, in order to obtain a TTL inverter having a relatively high "H" level output, a considerably complex circuit 90 was required between the transistor $Tr_{50}$ and the transistor $Tr_3$, as illustrated in FIG. 9. The circuit 90 acts as a noninverting gate. The noninverting gate 90 comprises a number of elements such as transistors $Tr_{91}$, $Tr_{92}$, and $Tr_{93}$, resistors $R_{91}$, $R_{92}$, and $R_{93}$, and a diode $D_{91}$. As mentioned before, such a number of elements as the above-mentioned ones not only deteriorates the degree of integration but also lowers the operating speed. By comparing the circuit of FIG. 8 with the conventional circuit of FIG. 9, it will be apparent that the embodiment of FIG. 8 is advantageous with respect to the degree of integration and the operating speed.

From the foregoing description, it will be apparent that, according to the present invention, in a TTL inverter, by providing two separate transistors for driving an off buffer circuit and for driving an inverted signal output transistor, respectively, and by making the input threshold voltage for turning on or off the one transistor different from that of another transistor, no transient current flows through the TTL inverter so that fluctuation of the power supply voltage due to the transient current can be prevented. Consequently, error operations of various circuits having a common power supply line with the TTL inverter can be prevented.

Further, according to the present invention, a TTL inverter having a relatively high "H" level output can easily be formed without decreasing the degree of integration and the operating speed.

I claim:
1. A TTL circuit including a power supply line and ground, comprising:
an input terminal for receiving an input signal having a high logic level and a low logic level;
an output terminal for providing a logic output signal;
an inverted signal output circuit including a first transistor having a base electrode operatively connected to said input terminal, having a collector electrode operatively connected to the power supply line and having an emitter electrode operatively connected to ground, and including a second transistor operatively connected between said first transistor and said output terminal, said inverted signal output circuit having a first threshold voltage and turning on in accordance with said high logic level input signal exceeding said first threshold voltage, making said logic output signal a low logic level;
an off-buffer driving circuit comprising a third transistor having a collector electrode operatively connected to the power supply line, having a base electrode operatively connected to said input terminal, having an emitter operatively connected to ground, and having a second threshold voltage lower than the first threshold voltage of said inverted signal output circuit; and
an off-buffer circuit, having a first control terminal operatively connected to said output terminal and having a second control terminal operatively connected to said collector electrode of said third transistor, said third transistor turning on upon receipt of said low logic input signal, making said logic output signal a high logic level, whereby said offbuffer circuit turns off upon receipt of said high logic level input signal before said inverted signal output circuit is turned on, and turns on upon receipt of said low logic level signal after said inverted signal output circuit is turned off.

2. A TTL circuit as set forth in claim 1, further comprising:
 a first resistor operatively connected between said input terminal and said base electrode of said third transistor;
 a second resistor operatively connected between the power supply line and said collector electrode of said third transistor; and
 a diode having a cathode operatively connected to ground and having an anode operatively connected to said emitter electrode of said third transistor, said first resistor having a resistance which allows the voltage at said input terminal to reach the first threshold voltage.

3. A TTL circuit as set forth in claim 2, further comprising a third resistor having a first terminal operatively connected to the power supply line and having a second terminal, wherein said off-buffer circuit comprises a fourth transistor and a fifth transistor in a Darlington connection, wherein said second control terminal is a base electrode of said fourth transistor and is operatively connected to said collector electrode of said third transistor, said fourth transistor having a collector electrode operatively connected to said second terminal of said third resistor, and said fourth transistor having an emitter electrode, said fifth transistor having a base operatively connected to said emitter electrode of said fourth transistor, said fifth transistor having a collector electrode operatively connected to said collector electrode of said fourth transistor, and wherein said first control terminal is an emitter electrode of said fifth transistor, operatively connected to said output terminal.

4. A TTL circuit as set forth in claim 2, further comprising a third resistor having a first terminal operatively connected to the power supply line and having a second terminal, wherein said off-buffer circuit comprises a single transistor, wherein said second control terminal of said single transistor is a base electrode operatively connected to said collector electrode of said third transistor, wherein said first control terminal of said single transistor is an emitter electrode operatively connected to said output terminal, and wherein said single transistor has a collector electrode operatively connected to said second terminal of said third resistor.

5. A TTL circuit as set forth in claim 3, wherein said first, second, third, and fourth transistors are Schottky barrier transistors.

6. A TTL circuit as set forth in claim 2, wherein said diode is a Schottky barrier diode.

* * * * *